United States Patent
Gonzalez et al.

(10) Patent No.: US 6,194,327 B1
(45) Date of Patent: Feb. 27, 2001

(54) RAPID THERMAL ETCH AND RAPID THERMAL OXIDATION

(75) Inventors: Fernando Gonzalez; Randhir P. S. Thakur, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/189,920

(22) Filed: Nov. 12, 1998

Related U.S. Application Data

(63) Continuation of application No. 08/582,587, filed on Jan. 3, 1996, now Pat. No. 5,869,405.

(51) Int. Cl.⁷ .................................................. H01L 21/316
(52) U.S. Cl. ..................... 438/770; 438/694; 438/706; 438/771; 438/906; 438/913
(58) Field of Search ..................................... 438/694, 706, 438/770, 771, 906, 913

(56) References Cited

U.S. PATENT DOCUMENTS

| | | | |
|---|---|---|---|
| 4,048,350 | 9/1977 | Glang et al. | 437/240 |
| 5,098,866 | 3/1992 | Clark et al. | 437/946 |
| 5,264,396 | 11/1993 | Thakur et al. | 437/238 |
| 5,328,558 | 7/1994 | Kawamura | 437/228 |
| 5,360,769 | 11/1994 | Thakur et al. | 437/239 |
| 5,397,909 | 3/1995 | Moslehi | 257/383 |
| 5,434,109 | 7/1995 | Geisser et al. | 437/239 |
| 5,489,557 | 2/1996 | Jolley | 156/640.1 |
| 5,498,577 | 3/1996 | Fulfurd, Jr. et al. | 437/228 |
| 5,538,923 | 7/1996 | Gardener et al. | 437/238 |
| 5,589,422 | 12/1996 | Bhat | 437/239 |

FOREIGN PATENT DOCUMENTS

| | | | |
|---|---|---|---|
| 562848 | 3/1992 | (EP) | 437/228 |
| 95/04372 | 2/1995 | (WO) | 437/228 |

OTHER PUBLICATIONS

Wolf, Stanley, "Silicon Processing for the VLSI Era," vol. 2, pp. 26–27 (1990).

El–Kareh, Badih, "Fundamentals of Semiconductor Processing Technologies," pp. 70–71 (1995).

*Primary Examiner*—Charles Bowers
*Assistant Examiner*—Lisa Kilday
(74) *Attorney, Agent, or Firm*—Workman, Nydegger & Seeley

(57) ABSTRACT

At least both a rapid thermal etch step and a rapid thermal oxidation step are performed on a semiconductor substrate in situ in a rapid thermal processor. A method including an oxidation step followed by an etch step may be used to remove contamination and damage from a substrate. A method including a first etch step followed by an oxidation step and a second etch step may likewise be used to remove contamination and damage, and a final oxidation step may optionally be included to grow an oxide film. A method including an etch step followed by an oxidation step may also be used to grow an oxide film. Repeated alternate in situ oxidation and etch steps may be used until a desired removal of contamination or silicon damage is accomplished.

38 Claims, 1 Drawing Sheet

RAPID THERMAL ETCH AND RAPID THERMAL OXIDATION

RELATED APPLICATIONS

This is a continuation of U.S. patent application Ser. No. 08/582,587, filed Jan. 3, 1996, now U.S. Pat. No. 5,869,405 titled "In Situ Rapid Thermal Etch and Rapid Thermal Oxidation", which is incorporated herein by reference.

BACKGROUND OF THE INVENTION

1. The Field of the Invention

The present invention relates to the manufacture of semiconductor devices, and particularly to the removal of damage or contamination, especially oxide containing contamination, from a semiconductor substrate, and the growth of extremely high quality oxide films during the manufacture of a semiconductor device. More particularly, the present invention is directed to improved methods for removing contamination and damage from a substrate, and for growing contamination-and defect-free oxide films on a substrate, by in situ rapid thermal etch and rapid thermal oxidation.

2. The Relevant Technology

Many of the steps performed in the manufacture of semiconductor devices require that contamination or damage be removed from a silicon substrate. The various processes typically used to remove contamination or damage generally may be classed as wet cleaning methods or dry cleaning methods. Wet cleaning of various types can introduce many types of contamination. Placing the substrate in contact with liquids tends to result in particulate contamination of the substrate. Dry cleaning methods employing plasma energy or similar energy sources can substantially avoid causing particulate contamination, but can cause lattice damage to the substrate. Dry cleaning methods without plasma or similar energy sources to assist the cleaning processes can avoid damage to the substrate, but are typically too slow for cost-effective manufacturing.

Deposition of extremely high-quality oxide films is also generally required in the manufacture of semiconductor devices, such as in deposition of gate oxides in state of the art field-effect transistors. Production of such extremely-high quality oxide films requires that the substrate be contamination-free and damage-free.

Effective, high-throughput cleaning methods resulting in a contamination-free and damage-free substrate are thus needed.

SUMMARY AND OBJECTS OF THE INVENTION

An object of the present invention is to provide improved methods for removal of contamination and damage of a substrate.

Another object of the present invention is to provide methods for removal of contamination and damage of a substrate, which methods provide increased throughput through the performance of multiple process steps in situ.

Yet another object of the present invention is to provide methods for removal of contamination and damage of a substrate, which methods include growing an extremely high-quality oxide film in situ after removal of said contamination and damage.

Still another object of the present invention is to provide methods for removal of contamination and silicon damage of a substrate due to stress from plasma etching or stress in the area of a field isolation region such as a LOCOS region, which methods may be readily performed by current processing equipment with little or no modification thereof.

In accordance with the present invention, at least both a rapid thermal etch step and a rapid thermal oxidation step are performed on a semiconductor substrate in situ in a rapid thermal processor. Various combinations of etch steps and oxidation steps may be employed for various purposes. A method including an oxidation step followed by an etch step may be used to remove contamination and damage from a substrate. A method including a first etch step, followed by an oxidation step and a second etch step, may likewise be used to remove contamination and damage, and a final oxidation step may optionally be included to grow an oxide film. A method including an etch step followed by an oxidation step may also be used to grow an oxide film. The performance of the various steps in situ in a rapid thermal processor improves throughput and reduces the opportunity for contamination. The elevated temperatures in the rapid thermal processor environment increase the reaction rates for the etch step without causing radiation damage to the substrate. The extremely short ramp up times and processing times of the rapid thermal processor keep diffusion effects quite small, preventing unwanted migration of dopants and impurities. These methods result in an extremely clean, damage-free substrate.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention provides particularly advantageous cleaning of a substrate which avoids introduction of particulate contamination and substrate damage by performing at least both one rapid thermal etch and one rapid thermal oxidation in situ in the same rapid thermal processor. The methods of the present invention also optionally include in situ growth of an extremely high-quality oxide film after cleaning is performed. The order and number of rapid thermal etch steps and rapid thermal oxidation steps may be varied in particular preferred embodiments as will be described below.

Figure 1:
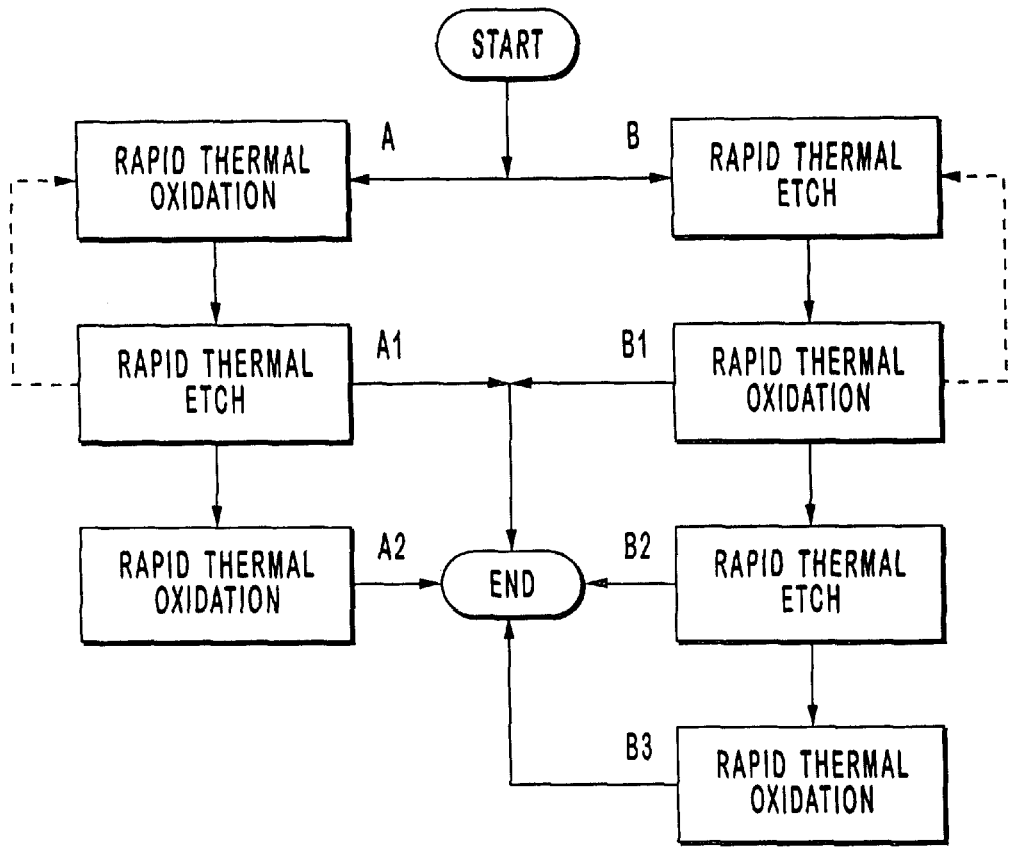
FIG. 1 is a flow chart of steps included in certain preferred methods according to the present invention.

FIG. 1 is a flow chart of steps in certain currently preferred methods according to the present invention. The flow chart of FIG. 1 includes five alternate paths: A1, A2, B1, B2 and B3. Each path includes at least a rapid thermal etch step and a rapid thermal oxidation step. Each path provides a different combination of rapid thermal etch steps and rapid thermal oxidation steps according to various preferred methods of the present invention. Each of the steps shown in the flow chart of FIG. 1 are to be performed in situ in a rapid thermal processor. In situ performance of the various steps ensures a minimum of contamination and increases throughput.

The rapid thermal oxidation steps in the flow chart of FIG. 1 are preferably performed by maintaining a substrate at a desired elevated temperature in a process chamber of a rapid thermal processor while flowing oxygen through the process chamber of the rapid thermal processor and around the substrate. Other oxidizing gas flows may also be employed. The temperature of the substrate for the oxidation steps should generally be within a range of about 800 to 1200° C., and most preferably within a range of about 950 to 1050° C.

The rapid thermal etch steps in the flow chart of FIG. 1 are similarly preferably performed by maintaining a substrate at a desired elevated temperature in a process chamber of a rapid thermal processor, while flowing an etchant through the process chamber of the rapid thermal processor and around the substrate. The etchant is to be used in neither a wet etch process nor a plasma dry etch process. Rather, the etchant flowed into the rapid thermal processor can be non-plasma fluorine gas ($F_2$) and non-plasma hydrogen gas ($H_2$). The etchant used is preferably hydrogen, fluorine, or a mixture of hydrogen and fluorine, supplied to the process chamber in a mixture with an inert gas or nonreactive gas, although any etchant suitable for high temperature use may be employed. The flow rate of hydrogen and fluorine is preferably within a range of 3% to 25% of the total gas flow rate.

The temperature at which the etch steps are performed may be identical to or different from the temperature at which the oxidation steps are performed, in which case an appropriate ramp up or ramp down of the temperature is used between steps. The temperature for the etch steps should be within a range of about 800 to 1200° C., and preferably within a range of 900 to 1050° C. A ramp-down to near ambient temperatures may optionally be employed between steps if desired, allowing temperature-driven control over the termination of the preceding step.

Additionally, a gas non-reactive in the particular process, such as nitrogen, or an inert gas non-reactive in virtually every process, such as argon, may optionally be flowed through the process chamber between steps.

Path A1 of the flow chart of FIG. 1 illustrates a substrate cleaning and damage removal method including a rapid thermal oxidation step followed by a rapid thermal etch step. The oxidation step oxidizes particle and film contaminants and damaged substrate areas, if any. The etch step removes the oxidized material, leaving behind a contamination-free, undamaged substrate.

Path A2 includes the steps of path A1 but adds at the end a second oxidation step for growing a high quality oxide on the just-cleaned substrate. Path A2 may thus be employed where it is desired to clean a substrate and then grow an oxide film thereon.

Path B2 of the flow chart of Figure is similar to path A1, except that a rapid thermal etch step precedes the rapid thermal oxidation step. Path B2, like path A1, is useful to provide a contamination-free, undamaged substrate, particularly where a first oxide film is present before the processing shown in FIG. 1. The first etch step then removes the first oxide film so that the oxidation step can more readily oxidize contaminants and damaged areas to create a second oxide film which is then removed by the second etch step.

Path B3 of the flow chart of FIG. 1 is similar path B2, except that a second oxidation step is added after the second etch step. The first etch step, the first oxidation step, and the second etch step of path B3 function to clean a substrate as explained above with respect to path B2. The second oxidation step then is used to grow a contamination-and defect-free oxide film. Path B3 may thus be employed where it is desired to clean a substrate and then grow an oxide film thereon.

Path B1 provides an alternate method for cleaning a substrate and growing a film thereon. Where the substrate has fewer contaminants and damage, or the removal of any contaminants and damage is less critical, path B1 may be used. In the method represented by path B1, an etch step removes any oxide from the substrate, along with any contamination or damage associated therewith, and then an oxidation step grows an oxide film.

Path B1 may be alternatively used a first time and a second time with additional process steps interposed between the first and second times. The first time of processing according to path B1 then grows an oxide film during the oxidation step which is later removed during the etch step of the second time of processing according to path B1, after which a final contamination-and defect-free oxide film is grown in the oxidation step.

The sequence of rapid thermal etch and rapid thermal oxidation steps may be repeated as needed as shown by the dashed arrows in FIG. 1. Thus methods having more steps than three or four, as shown in paths A2 and B3 for example, are available. Multiple alternating oxidation and etch steps are particularly useful where the substrate being cleaned is very sensitive to stress. Each oxidation step can be permitted to grow only a relatively thin oxide film, in a range of about 25 to 40 Angstroms, for example, thus avoiding the stresses created during the growth of thicker oxides.

The above inventive methods may be employed at any suitable stage of semiconductor fabrication. The methods which include growth and removal of an oxide film are particularly suited for producing a highly clean and defect-free substrate. The growth of the oxide film extends downward into the substrate, such that even subsurface contamination is removed when the oxide film is removed.

The above methods may be employed, for example, during the formation of active areas and oxide gates in the fabrication of FET devices. An example process flow for formation of active areas and gate oxide may include the steps shown in the first column of Table I below.

The method of path B1 of FIG. 1 may be used either to replace the typical means of removing the pad oxide and growing the sacrificial oxide in steps 6 and 7 of the example process flow of Table I, or to replace the typical means of removing the sacrificial oxide and growing the gate oxide in steps 12 and 13 of the example process flow of Table I, or both, as shown in the second column of Table I. The method of path B1 allows the combination of two typically separate steps into one short process, allowing for a potentially significant increase in throughput.

The method of path B3 of FIG. 1 may also be employed in a modified process flow for formation of active areas and gate oxide. As shown in the third column of Table I, The pad oxide removal step and sacrificial oxide growth step, steps 6 and 7 of the example process flow of Table I, may be omitted. The subsequent implants are then performed through the pad oxide layer. In place of steps 12 and 13 of the example process flow of Table I, the method of path B3 is then employed to remove the pad oxide, grow a sacrificial oxide, remove the sacrificial oxide, and grow the gate oxide.

In the examples in Table I, the etch step of the first application of path B1 or the first etch step of path B3 must be of sufficient duration to remove the pad oxide. The preferred pad oxide thickness is in a range of about 100 to 250 Angstroms. The sacrificial oxide grown in the oxidation step of the first application of path B1 or in the first oxidation step of path B3 is preferably in a range of about 250–350 Angstroms thick, and most preferably about 300 Angstroms thick. The gate oxide grown in the oxidation step of the second application of path B1, or in the second oxidation step of path B3, is preferably in a range of about 80 to 120 Angstroms thick, and most preferably about 100 Angstroms thick.

TABLE I

| Step No. | EXAMPLE PROCESS FLOW | PROCESS FLOW EMPLOYING PATH B1 | PROCESS FLOW EMPLOYING PATH B3 |
|---|---|---|---|
| 1 | Pad Oxide | Pad Oxide | Pad Oxide |
| 2 | Nitride Deposition | Nitride Deposition | Nitride Deposition |
| 3 | Active Area Patterning | Active Area Patterning | Active Area Patterning |
| 4 | Field Oxidation | Field Oxidation | Field Oxidation |
| 5 | Remove Nitride | Remove Nitride | Remove Nitride |
| 6 | Remove Pad Oxide | PATH B1 | |
| 7 | Grow SAC Oxide | | |
| 8 | Implant | Implant | Implant |
| 9 | LIF Pattern | LIF Pattern | LIF Pattern |
| 10 | Implants | Implants | Implants |
| 11 | Remove Resist | Remove Resist | Remove Resist |
| 12 | Remove SAC Oxide | PATH B1 | PATH B3 |
| 13 | Grow Gate Oxide | | |

As a further example, the inventive methods diagrammed in FIG. 1 may also be employed during preparation of the source/drain regions of a substrate for buried contact deposition. Prior art processes use a wet etch process or a plasma dry etch process to remove a native oxide layer in the buried contact region. The method of path B2 of FIG. 1 may be beneficially used to remove the native oxide layer and any other contaminants or damage without introducing additional damage or contamination. Additional etch and oxidation steps may be included as indicated by the dashed line in FIG. 1.

A first etch step is preferably performed in hydrogen at a temperature in a range of about 900–1200° C., most preferably 1000° C., for 5–15 seconds, and most preferably 10 seconds. This is followed by an oxidation step performed in oxygen at a temperature in a range of about 900–1200° C., most preferably 1000° C., for 20–40 seconds, and most preferably 30 seconds, to clean the surface by oxidizing it to produce a second oxide layer with a thickness in a range of about 25 to 50 Angstroms. This is followed by a second etch step performed in hydrogen at a temperature in a range of about 900–1200° C., most preferably 1000° C., for 20–40 seconds, and most preferably 30 seconds, to remove the second oxide layer. Additional identical oxidation and etch steps may be employed as needed to remove all contamination and silicon damage. It is presently preferred to perform at least four such identical oxidation and etch steps.

The above method is particularly useful to remove the so-called white ribbon or Kooi effect. The white ribbon or Kooi effect is an area of nitridized silicon damage that extends around the edges of an active area. An example of the location of white ribbon is illustrated in FIG. 2.

Figure 2:
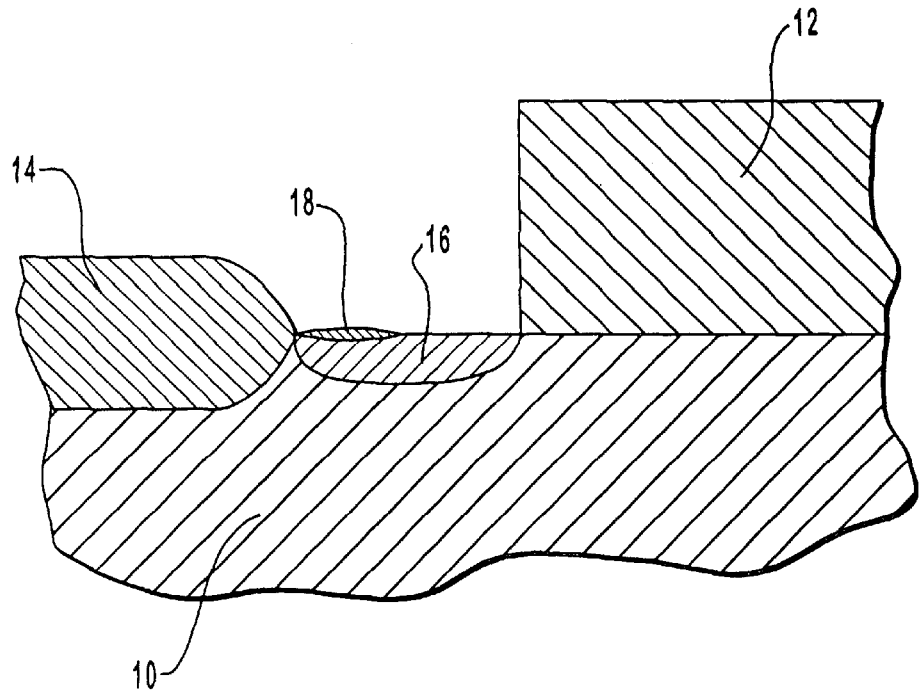
FIG. 2 is a partial cross section of a partially formed semiconductor device with which the methods of the present invention may be beneficially employed.

In FIG. 2, source/drain region 16 is formed in substrate 10. Substrate 10 has formed thereon a gate stack 12. Source/drain region 16 is at the edge of an active area, i.e., next to a field oxidation region 14. At the edges of the active area next to field oxidation 14 is formed white ribbon 18 which must be removed to permit the formation of a more reliable gate at the field edge. The above described alternating oxidation and etch steps, all performed in situ in the same rapid thermal processor, may be utilized to remove white ribbon 18 without causing damage to substrate 10 at source/drain region 16.

The method of path B2 may also be applied, in a manner similar to that described above, to formation of final contacts. With appropriate modifications of temperature and etch chemistry to protect any metal(s) used, the method above may also be applied for the removal of oxidation and contamination prior to formation of vias. The method of path A1 of FIG. 1 may alternatively be used in place of the method of path B2 where removal of a pre-existing oxide layer is not required.

The methods of the present invention may be performed in any standard rapid thermal processor provided with appropriate gas sources and flow controllers.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by U.S. Letters Patent is:

1. An etching method comprising:
   using hydrogen gas ($H_2$) and fluorine gas ($F_2$) to etch an oxide in a rapid thermal process, wherein said fluorine gas and said hydrogen gas are in a non-plasma state.

2. The method as defined in claim 1, wherein using hydrogen gas ($H_2$) and fluorine gas ($F_2$) to etch an oxide in a rapid thermal process further comprises:
   exposing said oxide to a non-reactive gas, wherein the fluorine gas and the hydrogen gas together are in a range of about 3% to 25% of the gases to which the oxide is exposed.

3. The method as defined in claim 1, further comprising exposing a substrate to oxygen gas form said oxide.

4. The method as defined in claim 3, wherein:
   exposing a substrate to oxygen gas form said oxide further comprises:
      holding the substrate at a first desired temperature while forming said oxidize; and
   using hydrogen gas ($H_2$) and fluorine gas ($F_2$) to etch an oxide in a rapid thermal process further comprises:
      holding said substrate at a second desired temperature while etching said oxide.

5. The method as defined in claim 4, wherein said first desired temperature is in a range of about 900 to 1200° C., and said second desired temperature is in a range of about 900 to 1200° C.

6. The method as defined in claim 5, wherein said first desired temperature is about 1000° C., and said second desired temperature is about 1000° C.

7. The method as defined in claim 3, further comprising repeating:

exposing a substrate to oxygen gas form said oxide; and
using hydrogen gas (H$_2$) and fluorine gas (F$_2$) to etch an oxide in a rapid thermal process;
until all previously present contamination and substrate damage on said substrate is removed, and wherein oxidizing said substrate comprises forming said oxide to have a thickness in a range of about 25 to 50 Angstroms.

8. The method as defined in claim 7, wherein said repeating occurs at least four times.

9. The method as defined in claim 1, wherein:
said oxide is on a substrate having a white ribbon on a surface thereof;
said oxide has a thickness in a range of about 25 to 50 Angstroms; and
the method further comprises repeating:
exposing a substrate to oxygen gas form said oxide; and
using hydrogen gas (H$_2$) and fluorine gas (F$_2$) to etch an oxide in a rapid thermal process;
until the white ribbon is removed from the surface on the substrate.

10. The method as defined in claim 9, wherein said repeating occurs at least four times.

11. The method as defined in claim 3, further comprising repeating at least four times:
using hydrogen gas (H$_2$) and fluorine gas (F$_2$) to etch an oxide in a rapid thermal process; and
exposing a substrate to oxygen gas form said oxide.

12. A method of processing a substrate during the fabrication of a semiconductor device, said method comprising:
heating a substrate having a first oxide layer thereon in a process chamber of a rapid thermal processor;
etching said first oxide layer in said process chamber of said rapid thermal processor to remove said first oxide layer, wherein etching said oxide layer comprises flowing non-plasma fluorine gas (F$_2$) and non-plasma hydrogen gas (H$_2$) into said process chamber of said rapid thermal processor; and
oxidizing said substrate in said process chamber of said rapid thermal processor to form a second oxide layer.

13. The method as defined in claim 12, wherein oxidizing said substrate comprises flowing oxygen gas into said process chamber of said rapid thermal processor.

14. The method as defined in claim 12, wherein etching said first oxide layer comprises flowing fluorine gas and hydrogen gas and a non-reactive gas into said process chamber of said rapid thermal processor, the flow rate of said fluorine gas and said hydrogen gas together as a percentage of the total gas flow into the process chamber being in a range of about 3% to 25%.

15. The method as defined in claim 12, wherein said first oxide layer has a thickness in a range of about 100 to 150 Angstroms, and said second oxide layer has a thickness in a range of about 250 to 350 Angstroms.

16. The method as defined in claim 12, wherein said first oxide layer has a thickness in a range of about 250 to 350 Angstroms and said second oxide layer has a thickness in a range of about 80 to 120 Angstroms.

17. The method as defined in claim 12, further comprising, after oxidizing said substrate in said process chamber of said rapid thermal processor, of:
etching said second oxide layer in said rapid thermal processor to remove said second oxide layer.

18. The method as defined in claim 17, wherein:
etching said first oxide layer comprises etching said substrate in an etchant gas at a temperature in a range of about 900 to 1200° C. for a time in a range of about 5 to 15 seconds;
oxidizing said substrate comprises oxidizing said substrate in oxygen gas at a temperature in a range of about 900 to 1200° C. for a time in a range of about 20 to 40 seconds; and
etching said second oxide layer comprises etching said second oxide layer in an etchant gas at a temperature in a range of about 900 to 1200° C. for a time in a range of about 20 to 40 seconds.

19. The method as defined in claim 17, further comprising repeating oxidizing said substrate in said process chamber of said rapid thermal processor and etching said second oxide layer in said rapid thermal processor until any previously present contamination and substrate damage is removed, and wherein oxidizing said substrate comprises forming an oxide layer having a thickness in a range of about 25 to 50 Angstroms.

20. The method as defined in claim 19, wherein repeating etching said first oxide layer in said process chamber of said rapid thermal processor and oxidizing said substrate in said process chamber of said rapid thermal processor comprises performing etching said first oxide layer in said process chamber of said rapid thermal processor and oxidizing said substrate in said process chamber of said rapid thermal processor at least four times.

21. The method as defined in claim 17, wherein:
heating a substrate comprises heating a substrate having a white ribbon on the surface thereof;
oxidizing said substrate comprises forming said second oxide layer having a thickness in a range of about 25 to 50 Angstroms; and
said method further comprises repeating oxidizing said substrate in said process chamber of said rapid thermal processor and etching said second oxide layer in said rapid thermal processor until the white ribbon is removed from the substrate.

22. The method as defined in claim 21, wherein repeating etching said first oxide layer in said process chamber of said rapid thermal processor and oxidizing said substrate in said process chamber of said rapid thermal processor comprises performing etching said first oxide layer in said process chamber of said rapid thermal processor and oxidizing said substrate in said process chamber of said rapid thermal processor at least four times.

23. The method as defined in claim 17, further comprising repeating etching said first oxide layer in said process chamber of said rapid thermal processor and oxidizing said substrate in said process chamber of said rapid thermal processor so that etching said first oxide layer in said process chamber of said rapid thermal processor and oxidizing said substrate in said process chamber of said rapid thermal processor are performed a total of a least four times.

24. The method as defined in claim 17, further comprising oxidizing said substrate in said rapid thermal processor to form a third oxide layer.

25. The method as defined in claim 24, wherein said first oxide layer has a thickness in a range of about 100 to 250 Angstroms, said second oxide layer has a thickness in a range of about 250 to 350 Angstroms, and said third oxide has a thickness in a range of about 80 to 120 Angstroms.

26. An etching method comprising:
using hydrogen gas (H$_2$) and fluorine gas (F$_2$) to etch a first oxide layer on a substrate in a rapid thermal process, wherein said fluorine gas and said hydrogen gas are in a non-plasma state;

oxidizing said substrate with a rapid thermal process to form a second oxide layer on said substrate;

implanting ions into said substrate;

heating said substrate in a rapid thermal process;

etching said second oxide layer in a rapid thermal process to remove said second oxide layer; and oxidizing said substrate in a rapid thermal process to form a third oxide layer on said substrate.

27. The method as defined in claim 26, wherein:

said first oxide layer has a thickness in a range of about 100 to 250 Angstroms;

said second oxide layer has a thickness in a range of about 250 to 350 Angstroms; and said third oxide has a thickness in a range of about 80 to 120 Angstroms.

28. A etching method comprising:

using hydrogen gas ($H_2$) and fluorine gas ($F_2$) to etch a first oxide on a substrate in a rapid thermal process, wherein said fluorine gas and said hydrogen gas are in a non-plasma state; and oxidizing said substrate to form a second oxide layer.

29. The etching method as defined in claim 28, wherein said fluorine gas and said hydrogen gas are in a range of about 3% to 25% of the total gas flow to which said first oxide layer is exposed in said rapid thermal process.

30. The etching method as defined in claim 28, wherein:

said first oxide layer has a thickness in a range of about 100 to 150 Angstroms; and said second oxide layer has a thickness in a range of about 250 to 350 Angstroms.

31. The etching method as defined in claim 28, wherein:

said first oxide layer has a thickness in a range of about 250 to 350 Angstroms and said second oxide layer has a thickness in a range of about 80 to 120 Angstroms.

32. The etching method as defined in claim 28, further comprising, after oxidizing said substrate:

etching said second oxide layer in a rapid thermal process to remove said second oxide layer.

33. The etching method as defined in claim 32, further comprising repeating oxidizing said substrate and etching said second oxide layer until any previously present contamination and substrate damage is removed.

34. The method as defined in claim 28, wherein:

said substrate has a white ribbon on the surface thereof;

oxidizing said substrate comprises forming said second oxide layer having a thickness in a range of about 25 to 50 Angstroms; and said method further comprises repeating oxidizing said substrate and etching said second oxide layer until the white ribbon is removed from the substrate.

35. A method of processing a substrate during the fabrication of a semiconductor device, said method comprising:

heating a substrate having a first oxide layer thereon in a process chamber of a rapid thermal processor;

etching said first oxide layer in said process chamber of said rapid thermal processor to remove said first oxide layer, wherein etching said oxide layer comprises flowing fluorine gas ($F_2$) and hydrogen gas ($H_2$) into said process chamber of said rapid thermal processor; and oxidizing said substrate in said process chamber of said rapid thermal processor to form a second oxide layer.

36. An etching method comprising:

using hydrogen gas ($H_2$) and fluorine gas ($F_2$) to etch a first oxide layer on a substrate in a rapid thermal process;

oxidizing said substrate with a rapid thermal process to form a second oxide layer on said substrate;

implanting ions into said substrate;

heating said substrate in a rapid thermal process;

etching said second oxide layer in a rapid thermal process to remove said second oxide layer; and oxidizing said substrate in a rapid thermal process to form a third oxide layer on said substrate.

37. An etching method comprising:

using hydrogen gas ($H_2$) and fluorine gas ($F_2$) to etch an oxide on a substrate in a rapid thermal process.

38. An etching method comprising:

using a hydrogen gas and a fluorine gas to etch an oxide in a rapid thermal process.

* * * * *

UNITED STATES PATENT AND TRADEMARK OFFICE
CERTIFICATE OF CORRECTION

| | | |
|---|---|---|
| PATENT NO. | : 6,194,327 B1 | Page 1 of 1 |
| APPLICATION NO. | : 09/189920 | |
| DATED | : February 27, 2001 | |
| INVENTOR(S) | : Fernando Gonzalez and Randhir P. S. Thakur | |

It is certified that error appears in the above-identified patent and that said Letters Patent is hereby corrected as shown below:

Col. 3, line 63, please change "Figure" to -- FIG. 1 --

Col. 4, line 29, please change "contamination-and" to -- contamination- and --

Col. 4, line 65, please change "Table I, The pad" to -- Table I, the pad --

Col. 6, line 49, please change "form" to -- forming --

Col. 6, line 51, please change "form" to -- forming --

Col. 7, line 1, please change "form" to -- forming --

Col. 7, line 17, please change "form" to -- forming --

Col. 7, line 29, please change "form" to -- forming --

Col. 7, line 62, please change "processor, of:" to -- processor: --

Col. 8, line 54, please change "a least four" to -- at least four --

Signed and Sealed this

Thirty-first Day of July, 2007

JON W. DUDAS
*Director of the United States Patent and Trademark Office*